United States Patent [19]

Ishibashi et al.

[11] Patent Number: 4,992,677
[45] Date of Patent: Feb. 12, 1991

[54] HIGH SPEED MOSFET OUTPUT BUFFER WITH LOW NOISE

[75] Inventors: Koichiro Ishibashi; Osamu Minato, both of Tokyo; Katsuhiro Shimohigashi, Musashimurayama, all of Japan

[73] Assignee: Hitachi, Ltd., Tokyo, Japan

[21] Appl. No.: 325,439

[22] Filed: Mar. 20, 1989

[30] Foreign Application Priority Data

Mar. 23, 1988 [JP] Japan .................................. 63-67375

[51] Int. Cl.⁵ .................. H03K 17/16; H03K 19/003; H03K 19/094; G11C 11/34
[52] U.S. Cl. .................................... 307/443; 307/451; 307/452; 307/449; 307/542; 307/552; 365/208; 365/189.06; 365/230.06
[58] Field of Search ............... 307/443, 448, 449, 463, 307/464, 494, 497, 500, 501, 542, 546, 547, 548, 549, 550, 552, 553, 554, 585, 264, 270, 451, 452; 330/253, 260, 269, 277; 365/206, 207, 208, 189.06, 230.06

[56] References Cited

U.S. PATENT DOCUMENTS

| | | | |
|---|---|---|---|
| 3,885,093 | 5/1975 | Mooney | 307/552 X |
| 4,739,198 | 4/1988 | Marayama | 365/208 X |
| 4,785,203 | 11/1988 | Nakamura | 307/542 X |
| 4,794,564 | 12/1988 | Watanabe | 365/189.06 |
| 4,864,164 | 9/1989 | Ohshima et al. | 307/554 X |
| 4,873,673 | 10/1989 | Hori et al. | 365/230.06 |

FOREIGN PATENT DOCUMENTS 190792 8/1986 Japan .................................. 365/208

OTHER PUBLICATIONS

National Convention Record, *The Institute of Electronics; Information and Communication*; part 2, pp. 2-218, 1987.

*Primary Examiner*—Stanley D. Miller
*Assistant Examiner*—David R. Bertelson
*Attorney, Agent, or Firm*—Antonelli, Terry, Stout & Kraus

[57] ABSTRACT

A semiconductor integrated circuit includes: a data output terminal; a first semiconductor element connected between a first operating potential point and the data output terminal; a second semiconductor element connected between the data output terminal and a second operating potential point; first control means connected to a control input terminal of the first semiconductor element; second control means connected to a control input terminal of the second semiconductor element; first generating means for generating a first predetermined voltage; and second generating means for generating a second predetermined voltage higher than the first predetermined voltage. When voltage at the data output terminal is higher than the second predetermined voltage, the first control means controls the first semiconductor element to be in the OFF-state, and the second control means controls the second semiconductor element to be in the ON-state to lower the voltage of the data output terminal to the second predetermined voltage. On the other hand, in the case where the voltage of the data output terminal is lower than that of the first predetermined voltage, the output of the first control means controls the first semiconductor element so that it is in the ON-state and the output of the second control means controls the second semiconductor element so that it is in the OFF-state so as to raise the voltage of the data output terminal to the first predetermined voltage.

9 Claims, 7 Drawing Sheets

HIGH SPEED MOSFET OUTPUT BUFFER WITH LOW NOISE

BACKGROUND OF THE INVENTION

This invention relates to a semiconductor integrated circuit, and in particular to a semiconductor integrated circuit provided with an output buffer circuit for sending signals within the semiconductor circuit to the exterior of the integrated circuit with a relatively high current drive ability.

Such a prior art device is disclosed in the National Convention Record, 1987, The Institute of Electronics, Information and Communication Engineers: Part 2, p. 2-218 (in Japanese). This prior art example has a function to preset the potential of the output terminal at a certain medium level.

SUMMARY OF THE INVENTION

A semiconductor integrated circuit having a number of output terminals had a problem that, in the case where a number of output buffers are driven simultaneously, since a large currents flow at the same time, it gives rise to large noise due to parasitic resistance and parasitic inductance in the power source line.

Further there was a problem that, in the case where data are outputted through the output terminals, a large delay is produced, when the potential of an output terminal is changed from the "H" level to the "L" level or from the "L" level to the "H" level.

According to the prior art techniques described above, it is possible to output data with a high speed by presetting the potential of the output terminal at a medium level before outputting data, because current is reduced and the potential difference for the output voltage discrimination level is decreased by decreasing the voltage amplitude, when data are outputted thereafter.

However, according to the prior art techniques, in order to hold the output terminal at a certain medium potential before the data are outputted, the drain-source paths of two control MOS transistors are connected between two gates of two output MOS transistors for outputting data, common a connecting node of these two control MOS transistors is connected with the data output terminal, and the control signals for presetting are applied to the gates of these two control MOS transistors.

However it has become clear by a study of the inventors of this invention that the prior art techniques have a problem, set forth in the following discussion.

That is, the medium potential between the high level and the low level of the gates of the two output MOS transistors is obtained by making the two control MOS transistors conductive by means of preset control signals, and this medium potential can be obtained through the data output terminals. In order to obtain the medium potential at the data output terminal with a high speed, it is necessary to set the time constant formed by the output capacitance of the data output terminal and the ON-resistance of the control MOS transistors for a small value.

However, a problem point has become clear from the inventor's studies that when the ON-resistance of the two control MOS transistors is set for a small value, the rush current flowing through the drain-source paths of the two control MOS transistors due to the potential difference between the high level and the low level at the gates of the two output MOS transistors is great, and, accordingly the power consumption is increased.

The object of this invention is to provide a low noise and high speed output circuit capable of solving the problem points of the prior art examples described above and provided with a function to hold the level of the output terminal at a certain potential before outputting data by reducing the rush current.

The above object can be achieved as follows.

Two potentials $V_H$ and $V_L$ are set, these potentials having a relation $V_H > V_L$. In the case where the output terminal is at first at the level "1", which is higher than $V_H$, the potential of the output terminal is lowered to $V_H$ by making only one element conductive, which makes current flow from the output terminal to the power source on the lower potential side. On the contrary, in the case where the output terminal is at first at the level "0", which is lower than $V_L$, the potential of the output terminal is raised to $V_L$ by making only another element conductive, which makes current flow from the power source on the higher potential side to the output terminal.

In the means described above, since current flows only through the element on the lower potential power source side, when the potential of the output terminal is changed from the level "1", which is higher than $V_H$, to $V_H$, and only through the element on the higher potential power source side, when the potential of the output terminal is changed from the level "0", which is lower than $V_L$, to $V_L$, in either of these cases no rush current flows therethrough.

Further, it is possible to feed back the potential of the output terminal by connecting one input of a differential amplifier with a reference voltage source and the other input thereof with the output terminal. In this way it is possible to set the potential of the output terminal for a predetermined potential.

DESCRIPTION OF THE PREFERRED EMBODIMENTS

Hereinbelow the preferred embodiments of this invention will be explained, referring to the drawings.

Figure 1A:
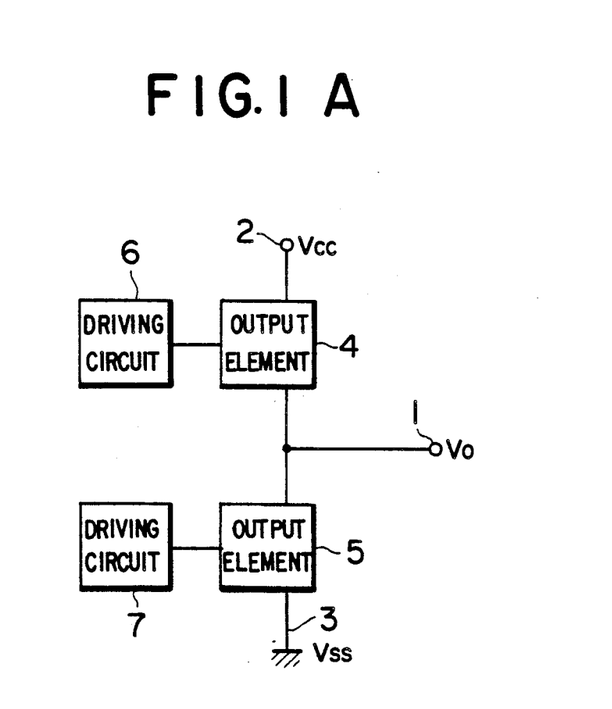
FIGS. 1A and 1B are a block diagram illustrating a fundamental embodiment of this invention and a scheme showing operating waveforms thereof, respectively.
Figure 1B:
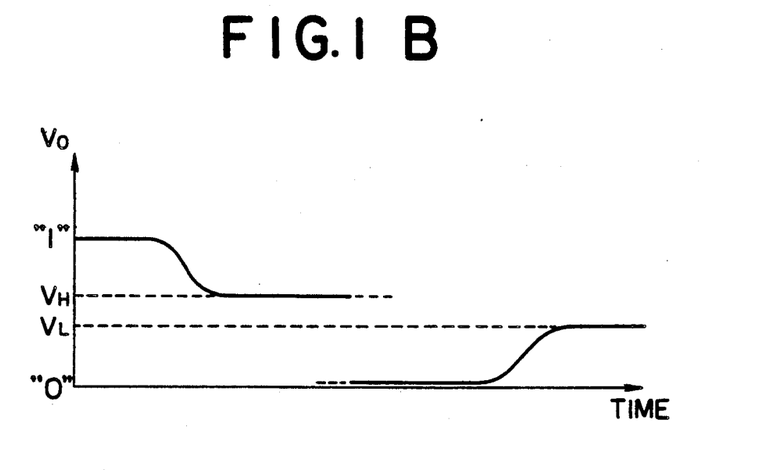

FIGS. 1A and 1B are a block diagram illustrating a fundamental embodiment of this invention and a scheme showing operating waveforms thereof, respectively, in which reference numeral 1 is a data output terminal; 2 is a $V_{CC}$ power source terminal; 3 is a $V_{SS}$ power source terminal; 4 is an element for pulling-up the potential of the output terminal 1 by making current flow from the $V_{CC}$ power source terminal 2 to the output terminal 1; and 5 is an element for pulling-down the potential of the output terminal 1 by making current flow from the output terminal 1 to the $V_{SS}$ power source terminal 2. Further 6 is a circuit driving the element 4, and 7 is a circuit driving the element 5. According to this invention, the driving circuits 6 and 7 are so constructed that this embodiment operates as indicated in FIG. 1B. That is, in the case where the output terminal 1 is at first at the level "1", which is higher than $V_H$, the element 5 is made conductive so as to lower the potential of the output terminal to $V_H$, and in the case where the output terminal 1 is at the level "0", which is lower than $V_L$, the element 4 is made conductive so as to raise the potential of the output terminal to $V_L$. This embodiment has a function that, at this time, when the potential of the output terminal has arrived at $V_H$ or $V_L$, the current flowing through the element 4 or 5 is cut-off so that the potential of the output terminal is stabilized.

Figure 2A:
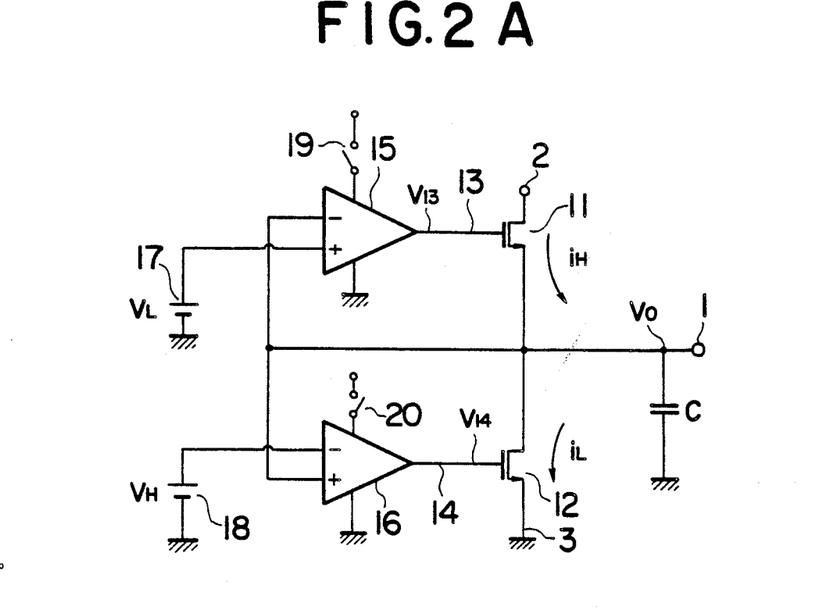
FIGS. 2A and 2B are a block diagram illustrating a concrete embodiment of this invention and a scheme showing operating waveforms thereof, respectively.
Figure 2B:
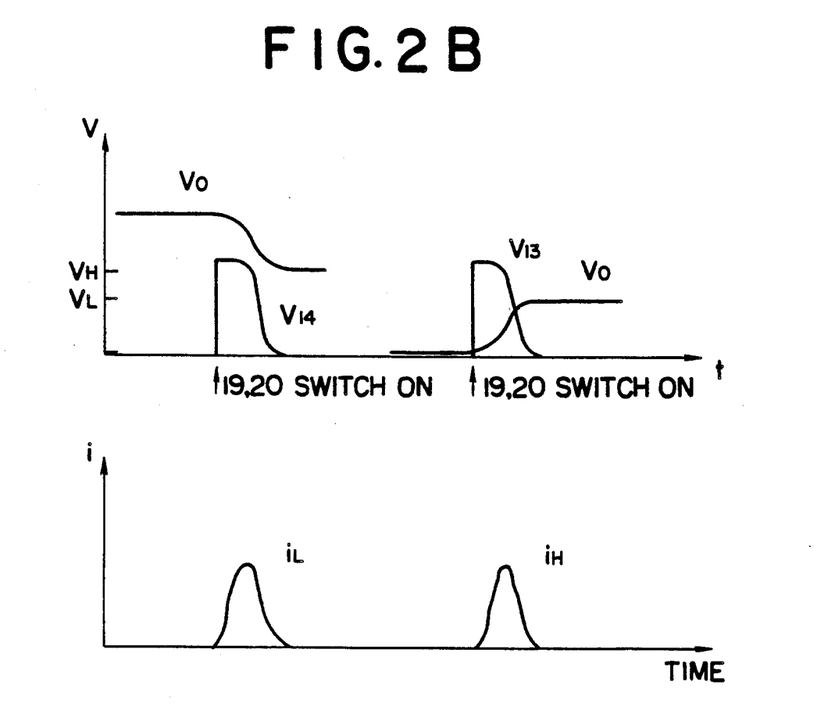

FIG. 2A and 2B are a block diagram illustrating a concrete embodiment of this invention and a scheme showing operating waveforms thereof, respectively. In FIG. 2A, 1 is the data output terminal; 11, 12 are N channel MOSFETs; 15, 16 are differential amplifiers, and 17, 18 are reference voltages. The reference voltages 17 and 18 may be produced by using electronic circuits. 19 and 20 are switches for operating the differential amplifiers 15 and 16, respectively. FIG. 2B shows operating waveforms thereof, in which $V_0$, $V_{13}$ and $V_{14}$ are waveforms representing variations of voltages inside thereof and $i_H$ and $i_L$ are current waveforms. The operating mode of this embodiment will be explained, referring to this figure. At first, in the case where $V_0$ is originally higher than $V_H$, when the switches 19 and 20 of the differential amplifiers are turned-on, a differential input $V_0-V_H>0$ is inputted in the differential amplifier 16, where it is amplified so that $V_{14}$ is raised to a high potential. On the other hand, since a differential input $V_L-V_0<0$ is inputted in the differential amplifier 15, $V_{13}$ is kept at the earth potential. As the result current ($i_L$) flows only through the NMOSFET 12, which lowers the voltage of $V_0$. In a short time, when the potential of $V_0$ is in agreement with that of $V_H$, $V_{14}$ is approximately at the earth potential and the potential of $V_0$ is stabilized. On the other hand, in the case where $V_0$ is originally lower than $V_L$, the signs of the differential input are inverted. Therefore only the potential of $V_{13}$ is raised so that current ($i_H$) flows only through the NMOSFET 11, which raises the potential of $V_0$, and when $V_0$ has arrived at $V_L$, the potential is stabilized. In this embodiment, if there were finally only one potential as in the prior art examples described above, i.e. if $V_M=V_H=V_L$, a problem would be produced that a rush current flows therethrough or that instability takes place in the circuit, because a potential, which is sufficient for turning-on the NMOSFETs 11 and 12, is produced in $V_{13}$ and $V_{14}$, when $V_0=V_M$. Consequently, according to the embodiment of this invention, $V_H>V_L$ is a necessary condition.

Figure 3A:
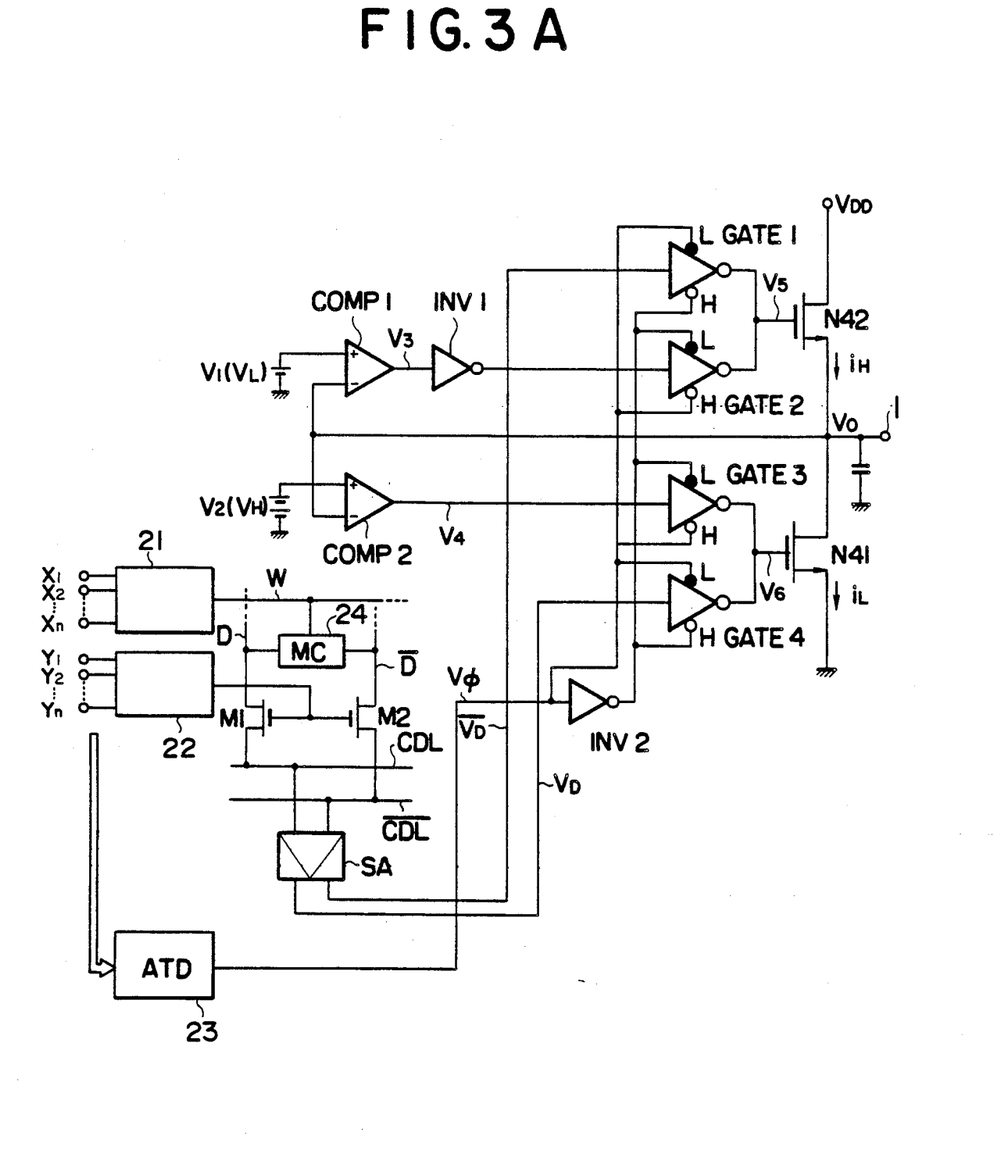
FIGS. 3A and 3B are a block diagram illustrating a more concrete embodiment of this invention and a scheme showing operating waveforms thereof, respectively.
Figure 3B:
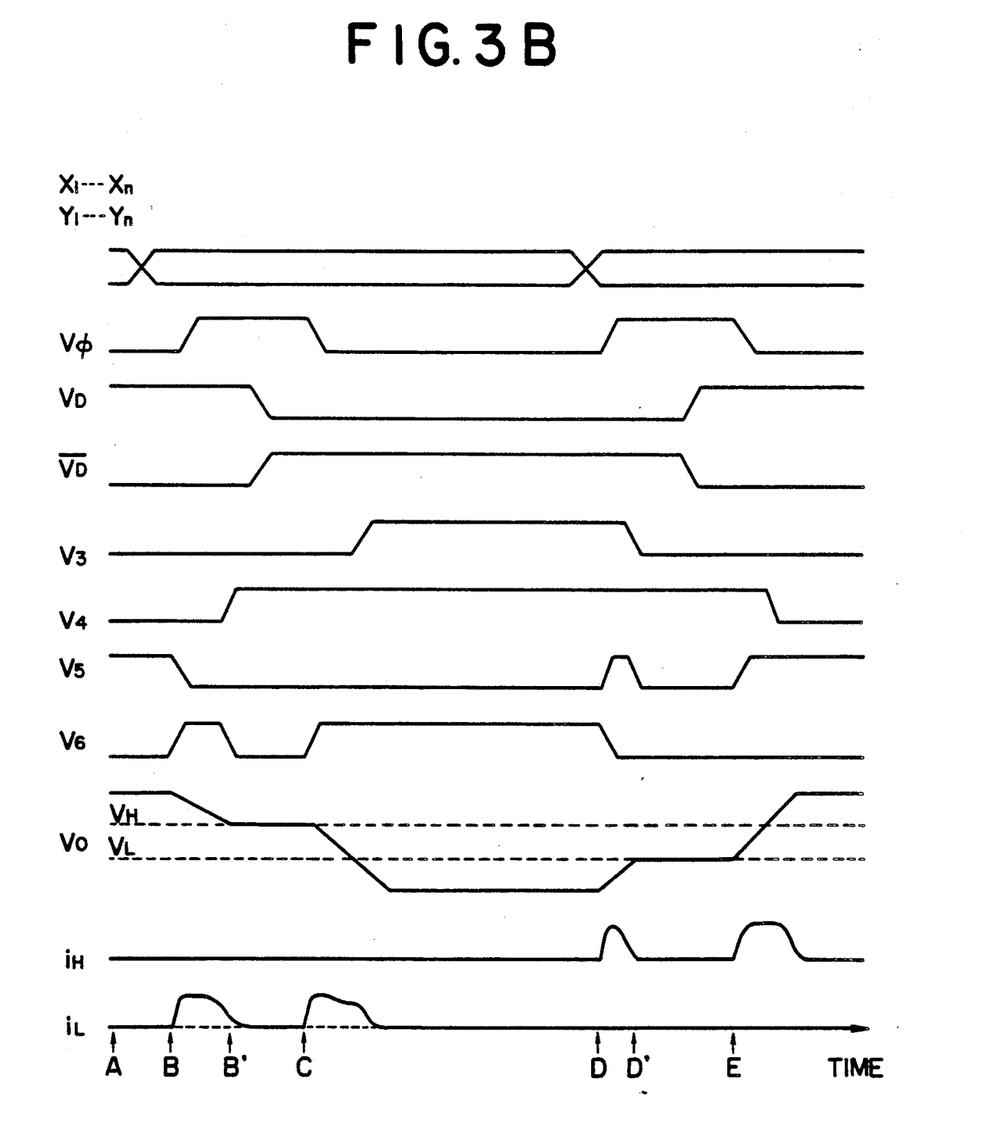

FIGS. 3A and 3B are a block diagram illustrating a more concrete embodiment of this invention and a scheme showing operating waveforms for explaining the operation thereof, respectively.

In the circuit diagram indicated in FIG. 3A, a driver 21 is a word driver selecting a word line W, responding to a group X address signal $X_1, X_2, \ldots, X_n$. The other driver 22 is a column group driver selecting a pair of data lines D and $\overline{D}$, responding to a group Y address signal $Y_1, Y_2, \ldots, Y_n$. A memory cell 24 is an SRAM cell connected with the word line W and the data lines D, $\overline{D}$. N channel MOS transistors M1 and M2 are transistors for transmitting the complementary signals of the data lines D, $\overline{D}$ to common data lines CDL, $\overline{CDL}$ by being driven by the column group driver 22. A sense amplifier SA is an amplifying means for amplifying the complementary signals from the common data lines CDL, $\overline{CDL}$ to generate complementary amplified signals $V_D$, $\overline{V_D}$. An address transition detecting circuit 23 is a generating means for generating a control signal $V\phi$, which is at a high level for a predetermined period of time, responding to level changes of the group X address signal $X_1, X_2, \ldots, X_n$ or the group Y address signal $Y_1, Y_2, \ldots, Y_n$. A power source $V_1$ is a power source for generating the lower set potential $V_L$, and a power source $V_2$ is a power source for generating the higher set voltage $V_H$. A voltage comparator COMP1 serves as a means for generating a comparison output $V_3$ through the output thereof, when the lower set potential $V_L$ is applied to the non-inverting input "+" and the output voltage $V_0$ through the output terminal 1 is applied to the inverting input. A voltage comparator COMP2 serves as a means for generating a comparison output $V_4$ through the output thereof, when the higher set potential $V_H$ is applied to the non-inverting input + and the output voltage $V_0$ through the output terminal 1 is applied to the inverting input −. An inverter INV1 is a means for inverting the comparison output $V_3$ of the voltage comparator COMP1, and an inverter INV2 is a means for inverting the control signal $V\phi$ from the address transition detecting circuit 13. A gate GATE1 is an inverter type signal transmitter, to the input of which the amplified signal $\overline{V_D}$ of the sense amplifier SA is supplied and the output of which is connected with the gate of an N-channel MOS transistor N42. Gate GATE2 is an inverter type signal transmitter, to the input of which the output signal of the inverter INV1 is supplied and the output of which is connected with the gate of an N-channel MOS transistor N42. Gate GATE3 is an inverter type signal transmitter, to the input of which the comparison output of the voltage comparator COMP2 is supplied and the output of which is connected with the gate of an N-channel MOS transistor N41. Finally, gate GATE4 is an inverter type signal transmitter, to the input of which the amplified signal $V_D$ of the sense amplifier SA is supplied and the output of which is connected with the gate of an N-channel MOS transistor N41. The N-channel MOS transistor N42 is a means for raising the output voltage of the output terminal 1 by making the charging current $i_H$ flow therethrough, while the N-channel MOS transistor N41 is a means for lowering the output voltage of the output terminal 1 by making the discharging current $i_L$ flow therethrough. In the case where the low level is applied to the upper side control input of each of the gates GATE1–GATE4, which is indicated by a black circle and the high level is applied to the lower side control input thereof, it is in the through-state, where the data signal transmission from the input to the output is allowed, and in the reverse case it is in the non-through-state, where this data signal transmission is inhibited.

Now the operation of the circuit indicated in FIG. 3A will be explained, referring to FIG. 3B. At a point of time A, the complementary signals $V_D$ and $\overline{V_D}$, which are at the high and the low levels, respectively, are read-out from the outputs of the sense amplifier SA.

When it is supposed that the output signal $V_0$ of the output terminal 1 is at the high level, both the comparison outputs $V_3$ and $V_4$ of COMP1 and COMP2 are at the low level. At this time, since the control signal $V_\phi$ is at the low level, GATE1 and GATE4 are in the through-state and GATE2 and GATE3 are in the non-through-state. Consequently, a signal, which is in opposite phase to the complementary signal $V_D$, is supplied to the gate of the N-channel MOS transistor N42 through GATE1 as the high level voltage $V_5$ and a signal, which is in opposite phase to the complementary signal $V_D$, is supplied to the gate of the N-channel MOS transistor N42 as the low level voltage $V_6$. However, at this time, since the charging of the output terminal 1 has been already terminated, the charging current $i_H$ of the N-channel MOS transistor N42 is zero.

When changes in the level of the X group address signal $X_1, X_2, \ldots, X_n$ or the Y group address signal $Y_1, Y_2, \ldots, Y_n$ take place, since the control signal $V_\phi$ is changed from the low level to the high level at a point of time B, GATE1 and GATE4 are turned to the non-through-state and GATE2 and GATE3 to the through-state. Consequently, the low level voltage $V_5$, which is in phase with respect to $V_3$, is supplied to the gate of the N-channel MOS transistor N42 through the inverter INV1 and the gate GATE2, which turns-off this transistor N42. On the other hand, the high level voltage $V_0$, which is in opposite phase to $V_4$, is supplied to the gate of the N-channel MOS transistor N41 through the gate GATE3, which turns-on this transistor N41. In this way the discharging current $i_L$ begins to flow through this transistor N41 and the output voltage $V_0$ of the output terminal 1 begins to be lowered.

At a point of time B', when the output voltage $V_0$ of the output terminal 1 is lowered to a value, which is approximately equal to the higher set potential $V_H$, by the discharge through the transistor N41, the comparison output $V_4$ of the voltage comparator COMP2 is changed from the low level to the high level. Then the low level voltage $V_6$, which is in opposite phase to the comparison output $V_4$, is supplied to the gate of the N-channel MOS transistor N41 through the gate GATE3, the discharging current $i_L$ is reduced to zero, and the output voltage $V_0$ of the output terminal 1 is set to a value, which is approximately equal to the higher set voltage $V_H$. During this operation, this complementary amplified signals $V_D$ and $\overline{V_D}$ of the sense amplifier SA are changed to the low level and the high level, respectively, responding to the reading-out of the data from the memory cell 24.

At a point of time C, when the control signal $V_\phi$ is turned to the low level, GATE1 and GATE4 are turned to the through-state and GATE2 and GATE3 are turned to the non-through-state. Consequently, the low level voltage $V_5$, which is in opposite phase to the amplified signal $\overline{V_D}$ of the sense amplifier SA, is supplied to the gate of the N-channel MOS transistor N42 through the gate GATE1 and this transistor N42 retains the OFF-state. On the other hand, the high level voltage $V_6$, which is in opposite phase to the amplified signal $V_D$ of the sense amplifier SA is supplied to the gate of the N-channel MOS transistor N41 through the gate GATE4 and this transistor N41 is turned to the ON-state. Then the discharging current $i_L$ begins to flow through this transistor N41 and the output voltage $V_0$ of the output terminal 1 begins to be lowered. When this discharging has been terminated, the discharging current $i_L$ is reduced to zero. Further, when the output voltage $V_0$ of the output terminal 1 is lowered to a value, which is approximately equal to the lower set potential $V_L$, the comparison output $V_3$ of the voltage comparator COMP1 begins to be raised towards the high level. The low level output voltage $V_0$ of the output terminal 1 constitutes effective read-out output data from the memory cell 24.

When changes in the level take place again in the X group address signal $X_1, X_2, \ldots, X_n$ or the Y group address signal $Y_1, Y_2, \ldots, Y_n$ before the point of time D, the control signal $V_\phi$ is changed from the low level to the high level at the point of time D, GATE1 and GATE4 are turned to the non-through-state and GATE2 and GATE3 are turned to the through-state. Consequently, the high level voltage $V_5$, which is in phase to $V_3$, is supplied to the gate of the N-channel MOS transistor N42 through the inverter INV1 and the gate2 and this transistor N42 is turned to the ON-state. On the other hand, the low level voltage $V_6$, which is in opposite phase to $V_4$, is supplied to the gate of the N-channel MOS transistor N41 through the gate GATE3 and this transistor N41 is turned to the OFF-state. In this way the charging current $i_H$ begins to flow through this transistor N42 and the output voltage $V_0$ of the output terminal 1 begins to be raised.

At a point of time D', when the output voltage $V_0$ of the output terminal 1 is raised to a value, which is approximately equal to the lower set potential $V_L$, by the charging through the transistor N42, the comparison output $V_3$ of the voltage comparator COMP1 is changed from the high level to the low level. Then, the low level voltage $V_5$, which is in phase to the comparison output $V_3$, is supplied to the gate of the N-channel MOS transistor N42 through the inverter INV1 and the gate GATE2 and the charging current $i_H$ is reduced to zero. Thus the output voltage $V_0$ of the output terminal 1 is set to a value, which is approximately equal to the lower set potential $V_L$. During this operation, the complementary amplified signals $V_D$ and $\overline{V_D}$ of the sense amplifier SA are varied to the high level and the low level, respectively, responding to the data reading-out from the memory cell 24.

At a point of time E, when the control signal $V_\phi$ is lowered to the low level, GATE1 and GATE4 are turned to the through-state and GATE2 and GATE3 are turned to the non-through-state. Consequently, the high level voltage $V_5$, which is in opposite phase to the amplified signal $\overline{V_D}$ of the sense amplifier SA, is supplied to the gate of the N-channel MOS transistor N42 through the gate GATE1 and the transistor N42 is turned to the ON-state. On the other hand, the low level voltage $V_6$, which is in opposite phase to the amplified signal $\overline{V_D}$ of the sense amplifier SA, is supplied to the gate of the N-channel MOS transistor N41 through the gate GATE4 and this transistor N41 is turned to the OFF-state. Then the charging current $i_H$ begins to flow through this transistor N42 and the output voltage $V_0$ of the output terminal 1 begins to be raised. When this charging has been terminated, the charging current $i_H$ is reduced to zero. Further, when the output voltage $V_0$ of the output terminal 1 is raised to a value, which is approximately equal to the higher set potential $V_H$, the comparison output $V_5$ of the voltage comparator COMP2 begins to be lowered towards the low level. This high level output voltage $V_0$ of the output terminal 1 constitutes effective read-out output data from the memory cell 24.

As explained above, in the embodiment indicated in FIGS. 3A and 3B, since the output voltage $V_0$ of the output terminal 1 is finally at the low level after having been once retained to the higher set potential $V_H$, when it is changed from the high level to the low level, it is prevented for a large discharging current $i_L$ to flow abruptly. Furthermore, since the output voltage $V_0$ of the output terminal 1 is finally at the high level after having been once retained to the lower set potential $V_L$, when it is changed from the low level to the high level, it is prevented for a large charging current $i_H$ to flow abruptly.

Figure 4:
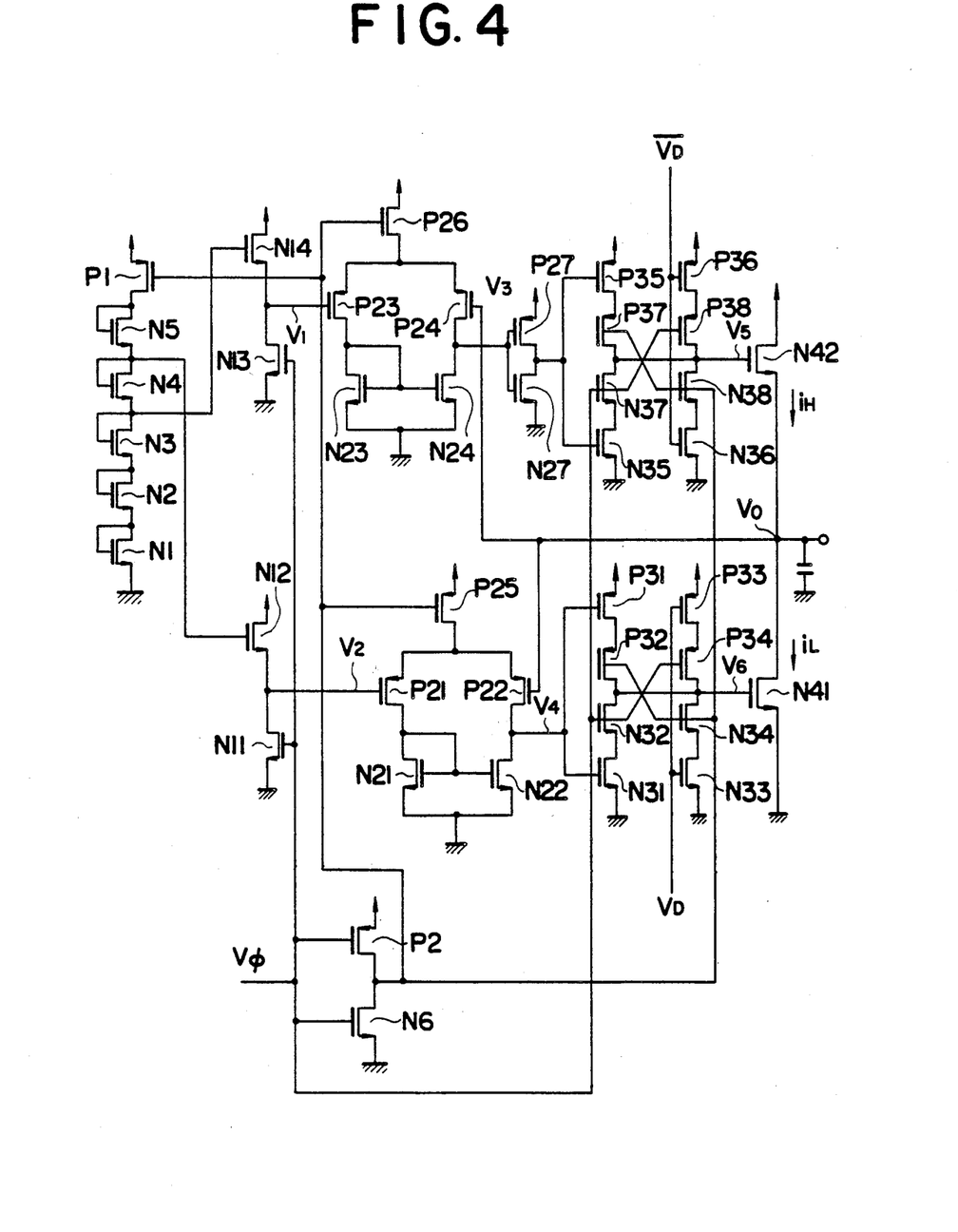
FIGS. 4 and 5 are a block diagram illustrating an improved embodiment of this invention and a scheme showing operating waveforms thereof, respectively.

FIG. 4 illustrates an improved circuit, which is an embodiment of this invention, in which the voltage comparators COMP1, COMP2, the inverters INV1, INV2, and the gates GATE1-GATE4 in the circuit indicated in FIG. 3A are constructed concretely by means of P- and N-channel MOS transistors, and in which the voltages $V_1$, $V_2$, $V_3$ and $V_4$ are kept at zero, unless they are otherwise required, so that useless power-consumption is reduced.

Figure 5:
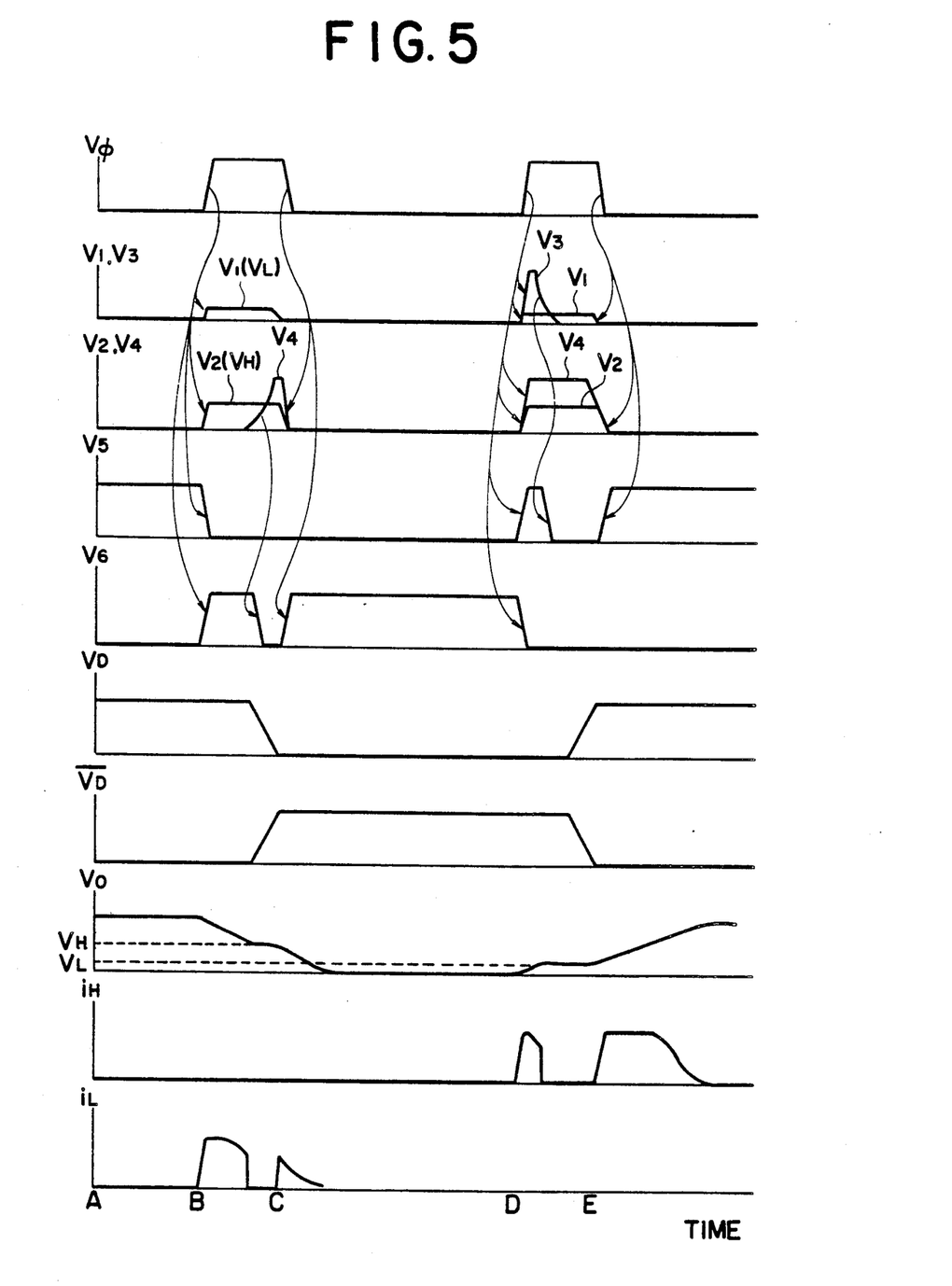

FIG. 5 shows the operating mode of the circuit of the embodiment indicated in FIG. 4.

At the point of time A, $V_D$ is "High" and $\overline{V_D}$ is "Low". At first, since the control signal $V_\phi$ is at the low level, the output of an inverter constructed by a P-channel MOS transistor P2 and an N-channel MOS transistor N6 is "High". Consequently, all of a P-channel MOS transistor P1 in a reference voltage generating circuit (N1–N5, P1), an N-channel MOS transistor N11 in a source follower circuit (N11, N12), an N-channel MOS transistor N13 in a source follower circuit (N13, N14), a P-channel MOS transistor P25 in a differential amplifier (N21, N22, P21, P22, P25) and a P-channel MOS transistor P26 in a differential amplifier (N23, N24, P23, P24, P26) become non-conductive so that all of the source follower outputs $V_1$ and $V_2$ and the outputs $V_3$ and $V_4$ of the differential amplifiers are at the ground potential and the output of an inverter constructed by a P-channel MOS transistor P27 and an N-channel MOS transistor N27 is "High". At this time, since $V_D$ is "Low" and $V_\phi$ is "Low", P-channel MOS transistors P36 and P38 in a multiplexer are conductive and the output $V_5$ of this multiplexer is "High". Further, since $V_D$ is "High" and the output of an inverter constructed by a P-channel MOS transistor P2 and an N-channel MOS transistor N6 is "High", N-channel MOS transistors N33 and N34 of a multiplexer are conductive and the output $V_6$ of this multiplexer is "Low". Consequently, although the output voltage $V_0$ of the output terminal 1 is "High", the charging of the load capacity of this output terminal 1 has been already terminated, the current $i_H$ flowing through the output N-channel MOS transistor is reduced to zero.

At the point of time B, when the control signal $V_\phi$ is changed from the low level to the high level, the output of the inverter constructed by the P-channel MOS transistor P2 and the N-channel MOS transistor N6 is "Low", all of the P-channel MOS transistor P1 in the reference voltage generating circuit (N1–N5, P1), the N-channel MOS transistor N11 in the source follower circuit (N11, N12), the N-channel MOS transistor N13 in the source follower circuit (N13, N14), the P-channel MOS transistor P25 in the differential amplifier (N21, N22, P21, P22, P25) and the P-channel MOS transistor P26 in the differential amplifier (N23, N24, P23, P24, P26) become conductive. Consequently, the source follower output $V_1$ is at the lower set potential $V_L$ and the other source follower output $V_2$ is at the higher set potential $V_H$. At this time, since the output voltage $V_0$ of the output terminal 1 is much higher than these set potentials $V_L$ and $V_H$, the P-channel MOS transistors P22 and P24 in the differential amplifiers are non-conductive. The outputs $V_3$ and $V_4$ of the differential amplifiers are held at the ground potential and the output of the inverter constructed by the P-channel MOS transistor P27 and the N-channel MOS transistor N27 is "High". At this time, since the control signal $V_\phi$ is at the high level and the output of the inverter constructed by the P-channel MOS transistor P2 and the N-channel MOS transistor N6, the N-channel MOS transistors N35 and N37 in the multiplexer are in the conductive state and the P-channel MOS transistors P31 and P32 in the other multiplexer are in the conductive state so that the outputs $V_5$ and $V_6$ of the multiplexers are changed to "Low" and "High", respectively. Consequently, the output N-channel MOS transistors N42 and N41 become non-conductive and conductive, respectively, and the discharging current $i_L$ flows through the N-channel MOS transistor N41 so that the output voltage $V_0$ of the output terminal 1 begins to be lowered. When the output voltage $V_0$ of the output terminal 1 during the lowering approaches the higher set potential $V_2$, the P-channel MOS transistor P22 in the differential amplifier starts to make current flow therethrough, and the output $V_4$ of this differential amplifier begins to be raised abruptly towards "High". Consequently, the P-channel MOS transistor P31 of the multiplexer is in the non-conductive state; the output $V_6$ of this multiplexer is changed to "Low"; the discharging current $i_L$ flowing through the N-channel MOS transistor N41 is reduced to zero; and the output voltage $V_0$ of the output terminal 1 is set for a value, which is approximately equal to the higher set potential $V_2$ ($V_H$).

At the point of time C, since the control signal $V_\phi$ is changed from the high level to the low level, $\overline{V_D}$ from "High" to "Low", and $\overline{V_D}$ from "Low" to "High", the output of the inverter constructed by the P-channel MOS transistor P2 and the N-channel MOS transistor N6 is "High" and all of the P-channel MOS transistor P1 in the reference voltage generating circuit (N1–N5, P1), the N-channel MOS transistor N11 in the source follower circuit (N11, N12), the N-channel MOS transistor N13 in the source follower circuit (N13, N14), the P-channel MOS transistor P25 in the differential amplifier (N21, N22, P21, P22, P25) and the P-channel MOS transistor P26 in the differential amplifier (N23, N24, P23, P24, P26) become non-conductive. Consequently, all of the source follower outputs $V_1$ and $V_2$ as well as the outputs $V_3$ and $V_4$ of the differential amplifiers are at the ground potential. Further, the P-channel MOS transistors P33 and P34 in the multiplexer are in the conductive state and the output $V_6$ of this multiplexer becomes "High" due to the fact that $V_D$ and $V_\phi$ are "Low". Consequently, the output N-channel MOS transistor N41 becomes conductive, and the discharging current $i_L$ begins to flow therethrough so that the output voltage $V_0$ of the output terminal 1 is lowered. Further, when the output voltage $V_0$ of the output terminal 1 is lowered to the ground potential, the discharging current $i_L$ flowing through the N-channel MOS transistor N41 is reduced to zero.

At the point of time D, when $V_\phi$ is changed from "Low" to "High", since the output of the inverter constructed by the P-channel MOS transistor P2 and the N-channel MOS transistor N6 becomes "Low", all of the P-channel MOS transistor P1 in the reference voltage generating circuit (N1–N5, P1), the N-channel MOS transistor N11 in the source follower circuit (N11, N12), the N-channel MOS transistor N13 in the source follower circuit (N13, N14), the P-channel MOS transistor P25 in the differential amplifier (N21, N22, P21, P22, P25) and the P-channel MOS transistor P26 in the differential amplifier (N23, N24, P23, P24, P26) become conductive so that the source follower output $V_1$ is at the lower set potential $V_L$ and the other source follower output $V_2$ is at the higher set potential $V_H$. At this time, the output voltage $V_0$ of the output terminal 1 has a value, which is much lower than these set potentials $V_L$ and $V_H$; the P-channel MOS transistors P22 and P24 in the differential amplifiers are in the conductive state; and the outputs $V_3$ and $V_4$ of the differential amplifiers are raised abruptly from the ground potential to "High". Consequently the output of the inverter (P27, N27) becomes "Low" and the P-channel MOS transistors P35 and P37 in the multiplexer are in the conductive state. In this way the output $V_5$ of this multiplexer becomes "High". Thus, the charging current $i_H$ begins to flow through the output N-channel MOS transistor N42 and the output voltage $V_0$ of the output terminal 1 begins to be raised from the ground potential to "High". When the output voltage $V_0$ of the output terminal 1 is raised towards the set potential $V_1$ ($V_L$), the output $V_3$ of the differential amplifier begins to be lowered abruptly towards "Low" and the output of the inverter (P27, N27) becomes "High". Consequently, the N-channel MOS transistors N35 and N37 in the multiplexer are in the conductive state; the output $V_5$ of this multiplexer is "Low"; the charging current $i_H$ flowing through the output N-channel MOS transistor N42 is reduced to zero; and the output $V_0$ of the output terminal 1 is retained to the lower set potential $V_1$ ($V_L$).

On the other hand, since the higher set potential $V_2$ ($V_H$) is applied to the gate of the P-channel MOS transistor P21 in the differential amplifier and the output potential $V_0$ of the output terminal 1, which is equal to the lower set potential $V_1$ ($V_L$), is applied to the gate of the other P-channel MOS transistor P22, the P-channel MOS transistor P22 is conductive and the output $V_4$ of this differential amplifier is fixed to "High". Therefore, the N-channel MOS transistor N31 of the multiplexer is conductive. On the other hand, the N-channel MOS transistor N32 is made conductive by $V_\phi$, which is "High", and the output $V_6$ in this multiplexer becomes "Low". Therefore, no discharging current $i_L$ flows through the output N-channel MOS transistor N41.

On the other hand, at the point of time E, when $V_\phi$ is changed from "High" to "Low", neither the P-channel MOS transistors P1, P25 and P26 nor the N-channel MOS transistors N11 and N12 is conductive. Therefore, $V_1$, $V_2$, $V_3$ and $V_4$ are "Low". Since $\overline{V_D}$ is changed from "Low" to "High" and $V_D$ from "High" to "Low", the P-channel MOS transistors P36 and P38 in the multiplexer are conductive, and the output $V_5$ of this multiplexer is "High". Consequently, the charging current $i_H$ flows through the output N-channel MOS transistor N42 and thus the output voltage $V_0$ of the output terminal 1 is raised. When the charging of this output terminal 1 has been terminated, the charging current $i_H$ flowing through the N-channel MOS transistor N42 is reduced to zero.

Figure 6:
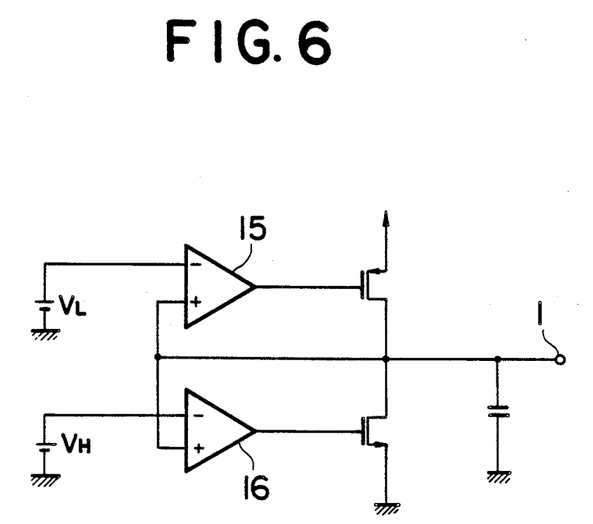
FIGS. 6 and 7 are block diagrams of different modified embodiments of this invention.

FIG. 6 shows a modified embodiment of this invention. This invention can be applied not only to the case where the output MOSs are NMOSFETs, as in the embodiments described above but also to the case where they are constructed by a CMOSFET, in which an NMOSFET and a PMOSFET are combined. This case is characterized in that the sign of the input to the differential amplifier 15 is inverse with respect to that in the embodiment indicated in FIG. 2A.

Figure 7:
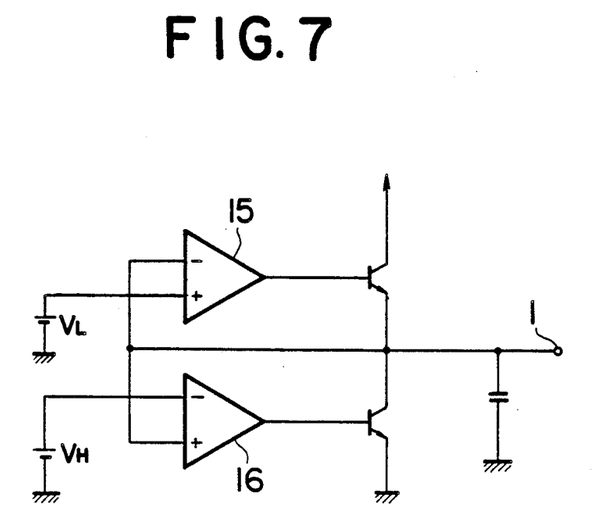

FIG. 7 shows a modified embodiment, in which this invention is applied to a circuit having an output stage consisting of bipolar transistors. In this case the differential amplifiers may be circuits consisting of bipolar transistors, MOSFETs or a combination thereof.

As described above, according to this invention, since it is possible to keep the output voltage at a predetermined value without making any rush current flow therethrough, it is possible to realize a low noise and high speed data output circuit. An effect can be obtained that, at this time, noise is reduced to about a half of that of the prior art method and the data output speed is increased to a level about as high as that obtained by the prior art method.

What is claimed is:

1. A semiconductor integrated circuit comprising:
  (1) a data output terminal;
  (2) a first semiconductor element having a control input terminal, whose output current path is connected between a first operating potential point and said data output terminal;
  (3) a second semiconductor element having a control input terminal, whose output current path is connected between said data output terminal and a second operating potential point;
  (4) a first controller connected to said control input terminal of said first semiconductor element;
  (5) a second controller connected to said control input terminal of said second semiconductor element;
  (6) a first generator for generating a first predetermined voltage; and
  (7) a second generator for generating a second predetermined voltage, which is higher than said first predetermined voltage,
  wherein the voltage of said first operating potential is higher than said second predetermined voltage, and the voltage of said second operating potential is lower than said first predetermined voltage,
  wherein in the case where the voltage of said data output terminal is higher than that of said second predetermined voltage, the output of said first controller controls said control input of said first semiconductor element so that the current flowing through said output current path of said first semiconductor element is substantially zero and the output of said second controller controls said control input of said second semiconductor element so that a second predetermined current flows through said output current path of said second semiconductor element, so as to lower said voltage of said data output terminal to a voltage, which is substantially equal to said second predetermined voltage, and
  wherein in the case where the voltage of said data output terminal is lower than that of said first predetermined voltage, the output of said first controller controls said control input of said first semiconductor element so that a first predetermined current flows through said output current path of said first semiconductor element and the output of said second controller controls said control input of said second semiconductor element so that the current flowing through said output current path of said second semiconductor element is substantially zero, so as to raise said voltage of said data output terminal to a voltage, which is substantially equal to said first predetermined voltage.

2. A semiconductor integrated circuit according to claim 1,
wherein said first controller carries out a voltage comparison, by which the voltage of said data output terminal and said first predetermined voltage are compared with each other; and
wherein said second controller carries out a voltage comparison, by which the voltage of said data output terminal and said second predetermined voltage are compared with each other.

3. A semiconductor integrated circuit according to claim 2, further comprising:
(8) a first gate circuit for transmitting a first signal to said control input terminal of said first semiconductor element;
(9) a second gate circuit for transmitting the output of said first controller to said control input terminal of said first semiconductor element;
(10) a third gate circuit for transmitting the output of said second controller to said control input terminal of said second semiconductor element; and
(11) a fourth gate circuit for transmitting a second signal, which is opposite in phase to said first signal, to said control input terminal of said second semiconductor element.

4. A semiconductor integrated circuit according to claim 3,
wherein said first and said second signals are complementary signals read-out from a memory cell in the semiconductor integrated circuit.

5. A semiconductor integrated circuit according to claim 4, further comprising:
(12) address selection circuits for accessing said memory in said semiconductor integrated circuit, responding to an address signal; and
(13) an address transition detector for generating a control pulse having a predetermined level during a predetermined period of time, responding to changes of said address signal;
wherein said predetermined level of said control pulse allows the signal transmission of said second and said third gate circuit and prohibits the signal transmission of said first and said fourth gate circuits.

6. A semiconductor integrated circuit comprising:
(1) a data output terminal;
(2) a first semiconductor element having a control input terminal, whose output current path is connected between a first operating potential point and said data output terminal;
(3) a second semiconductor element having a control input terminal, whose output current path is connected between said data output terminal and a second operating potential point;
(4) a first controller connected to said control input terminal of said first semiconductor element;
(5) a second controller connected to said control input terminal of said second semiconductor element;
(6) a first generator for generating a first predetermined voltage; and
(7) a second generator for generating a second predetermined voltage, which is higher than said first predetermined voltage,
wherein in the case where the voltage of said data output terminal is higher than that of said second predetermined voltage, the output of said first controller controls said control input of said semiconductor element so that the current flowing through said output current path of said first semiconductor element is substantially zero and the output of said second controller controls said control input of said second semiconductor element so that a second predetermined current flows through said output current path of said second semiconductor element, so as to lower said voltage of said data output terminal to a voltage, which is substantially equal to said second predetermined voltage,
wherein in the case where the voltage of said data output terminal is lower than that of said first predetermined voltage, the output of said first controller controls said control input of said first semiconductor element so that a first predetermined current flows through said output current path of said first semiconductor element and the output of said second controller controls said control input of said second semiconductor element so that the current flowing through said output current path of said second semiconductor element is substantially zero, so as to raise said voltage of said data output terminal to a voltage, which is substantially equal to said first predetermined voltage,
wherein said first controller carries out a voltage comparison, by which the voltage of said data output terminal and said first predetermined voltage are compared with each other, and
wherein said second controller carries out a voltage comparison, by which the voltage of said data output terminal and said second predetermined voltage are compared with each other.

7. A semiconductor integrated circuit according to claim 6, further comprising:
(8) a first gate circuit for transmitting a first signal to said control input terminal of said first semiconductor element;
(9) a second gate circuit for transmitting the output of said first controller to said control input terminal of said first semiconductor element;
(10) a third gate circuit for transmitting the output of said second controller to said control input terminal of said second semiconductor element; and
(11) a fourth gate circuit for transmitting a second signal, which is opposite in phase to said first signal, to said control input terminal of said second semiconductor element.

8. A semiconductor integrated circuit according to claim 7,
wherein said first and said second signals are complementary signals read-out from a memory cell in the semiconductor integrated circuit.

9. A semiconductor integrated circuit according to claim 8, further comprising:
(12) address selection circuits for accessing said memory in said semiconductor integrated circuit, responding to an address signal; and
(13) an address transition detector for generating a control pulse having a predetermined level during a predetermined period of time, responding to changes of said address signal,
wherein said predetermined level of said control pulse allows the signal transmission of said second and said third gate circuit and prohibits the signal transmission of said first and said fourth gate circuits.

* * * * *